United States Patent [19]
Howells et al.

[11] Patent Number: 5,915,910
[45] Date of Patent: Jun. 29, 1999

[54] SEMICONDUCTOR WAFER TRANSFER METHOD AND APPARATUS

[75] Inventors: John Howells, West Linn; Randall W. Peltola, Hillsboro, both of Oreg.

[73] Assignee: Daitron, Inc., Willsonville, Oreg.

[21] Appl. No.: 08/920,476

[22] Filed: Aug. 29, 1997

[51] Int. Cl.⁶ .................................................. B65G 1/06
[52] U.S. Cl. .......................... 414/331; 414/416; 414/752; 414/763; 414/773; 414/811; 414/936; 414/937; 414/941
[58] Field of Search ..................... 414/331, 416, 414/751, 752, 811, 937, 941, 935, 936, 761–763, 773

[56] References Cited

U.S. PATENT DOCUMENTS

| | | | |
|---|---|---|---|
| 3,314,554 | 4/1967 | Cuniberti | 414/773 X |
| 4,056,198 | 11/1977 | Boserup | 414/416 X |
| 4,449,885 | 5/1984 | Hertel et al. | 414/750 |
| 4,529,353 | 7/1985 | Dean et al. | 414/937 X |
| 4,586,743 | 5/1986 | Edwards et al. | 414/941 X |
| 4,744,715 | 5/1988 | Kawabata et al. | 414/331 |
| 4,770,590 | 9/1988 | Hugues et al. | 414/937 X |
| 4,773,687 | 9/1988 | Bush et al. | 414/941 X |
| 4,775,281 | 10/1988 | Prentakis | 414/937 X |
| 4,778,331 | 10/1988 | Kimata et al. | 414/937 X |
| 4,778,332 | 10/1988 | Byers et al. | 414/941 X |
| 4,816,116 | 3/1989 | Davis et al. | 414/222 X |
| 4,900,212 | 2/1990 | Mikahara | 414/937 X |
| 5,004,399 | 4/1991 | Sullivan et al. | 414/937 X |
| 5,011,366 | 4/1991 | Miller | 414/937 X |
| 5,188,501 | 2/1993 | Tomita et al. | 414/416 |
| 5,193,969 | 3/1993 | Rush et al. | 414/404 |
| 5,193,972 | 3/1993 | Engelbrecht | 414/416 X |
| 5,207,548 | 5/1993 | Suffel et al. | 414/404 |
| 5,261,776 | 11/1993 | Burck et al. | 414/416 |
| 5,275,521 | 1/1994 | Wada et al. | 414/331 X |
| 5,299,901 | 4/1994 | Takayama et al. | 414/938 X |
| 5,382,128 | 1/1995 | Takahashi et al. | 414/416 X |
| 5,738,482 | 4/1998 | Piazza | 414/752 |
| 5,772,386 | 6/1998 | Mages et al. | 414/937 X |

FOREIGN PATENT DOCUMENTS

| | | | |
|---|---|---|---|
| 0493117 | 7/1992 | European Pat. Off. | 414/437 |
| 5-47728 | 2/1993 | Japan | 414/941 |
| 6-127621 | 5/1994 | Japan | 414/937 |

*Primary Examiner*—David A. Bucci
*Attorney, Agent, or Firm*—Klarquist Sparkman Campbell Leigh & Whinston, LLP

[57] ABSTRACT

A wafer transfer mechanism and method involves inserting a wafer carrying arm into position within a wafer cassette so that a wafer may be detachably coupled to the arm. The arm is moved linearly to position the arm for coupling to the wafer, with the motion being reversed to remove the wafer from the cassette. After the arm clears the cassette, the arm may be pivoted about an axis which is transverse to the longitudinal axis of the arm to invert the wafer and deposit it at a destination location, such as onto a conveyor. A vacuum may be used to detachably couple the wafer to the arm with the vacuum being relieved to release the wafer at the destination location. A puff or pulse of air may be used to assist in decoupling the wafer from the arm.

16 Claims, 4 Drawing Sheets

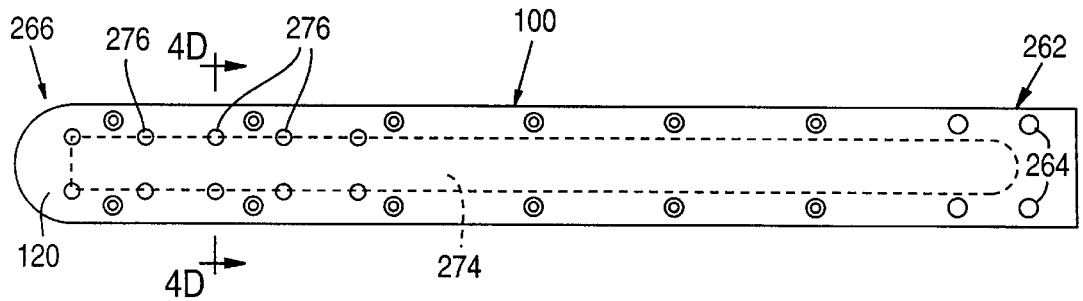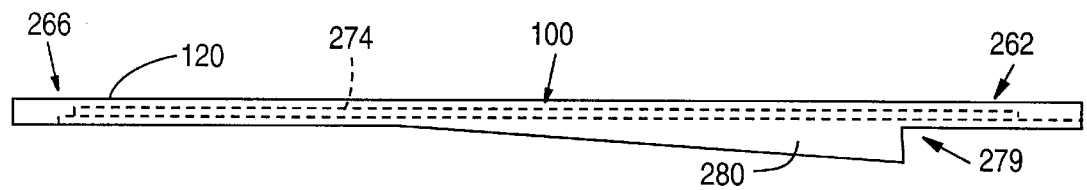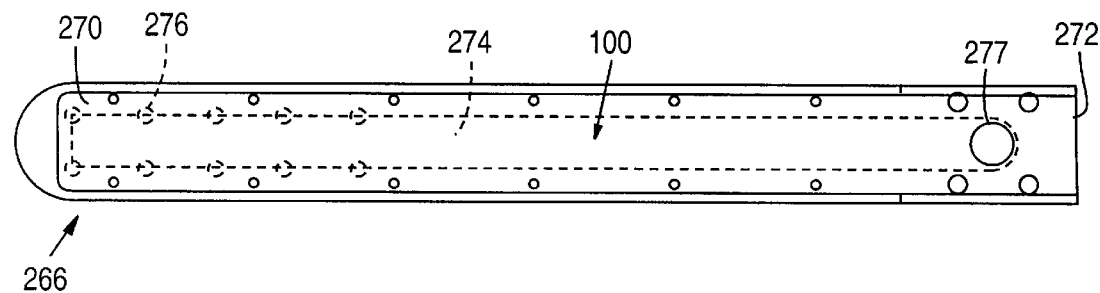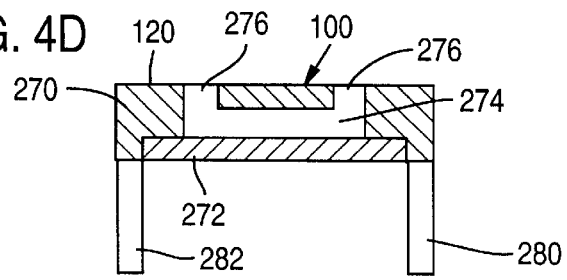

SEMICONDUCTOR WAFER TRANSFER METHOD AND APPARATUS

BACKGROUND OF THE INVENTION

1. Field of the Invention

This invention pertains to mechanisms that transport and move semiconductor wafers during their fabrication process. More particularly, this invention relates to mechanisms that remove wafers from a wafer holder such as a wafer cassette and transfer the wafers to a destination location for subsequent operations.

2. Background

During semiconductor fabrication, ingots are formed and sliced into wafers. The wafers proceed through many steps that require the wafers to be temporarily stored, transported and positioned. Wafer cassettes are often used for some of the temporary storage and transportation of wafers. Cassettes are typically slotted containers which are open at the top and which have four side walls and a bottom. Inner surfaces of two opposing side walls are fluted to create slots. Individual wafers are each positioned within a respective slot and are held therein, separated from adjacent wafers. When a cassette is fully loaded, the wafers are located in respective slots and spaced apart from one another so that wafers do not abut one another. Cassettes are therefore useful for storage and transportation of a group or stack of wafers.

Efficient fabrication requires that wafers be quickly and securely transported from one station to another. And, because wafers are expensive and fragile, the wafers must be handled in a manner to prevent damage or breakage.

U.S. Pat. No. 5,299,901 describes prior art mechanisms that remove wafers from a cassette and move them to a wafer "boat." Early mechanisms used mechanical tweezers or vacuum tweezers to grip individual wafers and remove them from a cassette and move them. However, these gripper mechanisms could damage some of the wafers. A later transfer mechanism used a "pusher" to push individual wafers up and out of a cassette. A pair of clamps would then grip the wafer and move it.

In the wafer transfer mechanism described in the '901 patent, a cassette is attached to a platform and inverted. A wafer boat is located below the inverted cassette and a "lifter" is raised into position below a wafer so that the wafer comes to rest on the lifter. The lifter is then lowered and the wafer, resting on the lifter, descends into the boat waiting below. The wafer is thus transferred from the cassette to the boat.

The wafer transfer mechanism described in U.S. Pat. No. 5,299,901 transfers wafers between devices that can be moved and located vertically atop one another. It does not appear capable of transferring a wafer to another device that is located in a horizontal plane; nor does the transfer mechanism appear capable of placing a wafer on horizontal surface. These are some of the limitations that prevent this prior art transfer mechanism from efficiently transferring wafers to some types of work stations and horizontal conveyors.

Another known wafer transfer mechanism has an elongated arm which is inserted beneath a wafer in a cassette. The arm is removed from the cassette with the wafer coupled to the arm using a vacuum. The arm is then rotated about its longitudinal axis to turn the wafer for delivery to a second location.

Although these prior art wafer transfer mechanisms exist, a need remains for an improved wafer transfer apparatus.

SUMMARY OF THE INVENTION

The present invention provides a wafer handling mechanism that transfers a wafer from one location to another. In particular, the present mechanism extracts a wafer from a stack of spaced-apart wafers, typically from a stack of wafers in a wafer cassette, and quickly and securely transports the wafer to a desired location such as a work station, transfer table or conveyor.

In an illustrated embodiment, the present mechanism transfers the wafer from the cassette to the wafer's destination efficiently and quickly by an arm that detachably couples to the wafer, extracts the wafer from the cassette, inverts and repositions the wafer at its destination.

In accordance with the method of the present invention, an elongated wafer transfer arm has a longitudinal axis. The arm is positioned so as to place an upwardly facing wafer engaging surface, located at the distal end of the arm, beneath a wafer when the wafer is at a first location. The wafer is detachably coupled to the wafer engaging surface, such as by drawing a vacuum between the wafer and wafer engaging surface. The distal end of the arm is pivoted through a substantial arc and about an arm pivot axis which is transverse to the longitudinal axis of the arm. Most preferably the arm is pivoted about an arm pivot axis which is orthogonal to the longitudinal axis of the arm. As a result the wafer engaging surface and the wafer is flipped over or inverted and moved to a downwardly facing orientation above a second location where the wafer is to be transferred. The wafer is then released from the wafer engaging surface to deposit the wafer at the second location.

The steps are typically repeated to transfer multiple wafers from the first location to the second location, such as to transfer an entire or partially filled cassette of wafers between these locations. In an application wherein wafers are transferred from a cassette, the arm is positioned at the first location by inserting the arm beneath an individual wafer in a stack of spaced apart wafers supported in the cassette. The wafer engaging surface is thus placed beneath a wafer at the first location. The wafer engaging surface is then typically shifted upwardly to engage the wafer with the surface then being coupled to the wafer.

In accordance with a more specific aspect of the invention, the elongated wafer transfer arm is most preferably linearly translated to position the wafer engaging surface of the wafer transfer arm beneath the wafer. The arm is then linearly translated in a second direction opposite to the first direction with the wafer detachably coupled to the wafer engaging surface to thereby remove the distal end portion of the arm and the coupled wafer from the stack of wafers. The arm is then pivoted about the arm pivot axis to position the coupled wafer above a second location with the wafer engaging surface being shifted to a downward orientation. The wafer is then released to complete the transfer of the wafer between the first and second locations.

In an illustrated embodiment of an apparatus for extracting an individual wafer from a stack of spaced apart wafers, such as in a wafer cassette, the wafer handling apparatus includes a base. A platform is movably coupled to the base for movement relative to the base between first and second positions. An elongated arm with a longitudinal axis has a first or proximate arm end portion pivotably coupled to the platform for pivoting about an arm pivot axis which is transverse to the longitudinal axis. The arm also has a distal end portion spaced from the first arm end portion. The distal end portion of the arm has a wafer engaging surface. As the arm is pivoted relative to the platform, the wafer engaging surface travels between a wafer loading position in which the wafer engaging surface is upwardly oriented to a wafer unloading position in which the wafer engaging surface is downwardly oriented. A platform mover operates to shift the platform relative to the base between the first and second positions. An arm pivoter pivots the arm about the arm pivot axis to shift the wafer engaging surface from the wafer loading position to the wafer unloading position. The wafer handling apparatus is operable to extract and transfer an individual wafer from the stack by shifting the platform from the first position to the second position in which the wafer engaging surface is placed beneath an individual wafer, selectively coupling the wafer to the wafer engaging surface, shifting the platform and thereby the coupled wafer to the second position, pivoting the arm to move the wafer engaging surface between the wafer loading position and the wafer unloading position above the destination to which the wafer is to be transferred, and releasing the coupled wafer from the wafer engaging surface to transfer the wafer to the destination.

A vacuum coupler may be used to selectively apply a vacuum between the wafer engaging surface and a wafer to thereby detachably couple the wafer to the wafer engaging surface as the wafer is shifted between the first location and the destination location. At the destination location, the vacuum is relieved to release the wafer from the arm.

In accordance with another aspect of the present invention, the platform is mounted to the base for sliding movement in a first linear direction to move the platform from the first position to the second position, and in a second linear direction opposite to the first linear direction to move the platform from the second position to the first position.

Geometrically, with reference to a three-dimensional reference system having orthogonal X, Y and Z axes, and where the X-Z, X-Y and Y-Z axes lie in orthogonal planes, a specific embodiment of the wafer handling apparatus translates the platform relative to the base along the X axis between first and second positions. In addition, an elongated arm having a distal end portion and a proximal end portion pivoted to the platform is pivoted in the X-Z plane between first and second arm positions. When the arm is in the first arm position, a wafer engaging surface at the distal end of the arm is oriented upwardly. In addition, when the arm is in the second position, the wafer engaging surface is oriented downwardly. In operation, the platform is moved along the X axis to position the wafer engaging surface into position for engaging a wafer, the wafer is engaged, the platform is moved along the X axis in the opposite direction to remove the arm and a wafer coupled to the arm from a stack of wafers, the arm is pivoted in the X-Z plane to shift the coupled wafer to a destination location and the wafer is released. Although variable, most preferably the wafer handling apparatus has an arm pivoter which is operable to pivot the arm through a major arc, such as at least about 180 degrees between the first and second arm positions.

The wafers may be carried in a wafer cassette which is placed in an elevator. The elevator is movable along an upright axis to shift the cassette along the upright axis. The movement of the cassette indexes wafers held in the cassette into a position for selectively coupling to the wafer engaging surface of the arm. Following the extraction of an individual wafer, the cassette is indexed to position the next wafer at a location for coupling to the arm when the wafer handling apparatus is operated to retrieve the next wafer from the cassette. In the illustrated embodiment, the cassette is indexed along the Z axis.

In accordance with the illustrated embodiment of the present invention, the Z axis is preferably substantially vertical and the X-Z plane is in a plane which is also preferably substantially vertical.

It is accordingly one object of the present invention to provide an improved apparatus and method for transferring wafers from a first location to a second location and most preferably to transfer individual wafers from a stack of wafers at a first location to a second location.

The foregoing and additional features, objects and advantages of the present invention will be more apparent from the following detailed description, which proceeds with reference to the accompanying drawings.

BRIEF DESCRIPTION OF THE DRAWINGS

FIGS. 4A–4D are, respectively, a top plan view, a side elevational view, a partially broken away bottom view and a vertical sectional view of a wafer transfer arm used in the embodiment of FIG. 1.

DETAILED DESCRIPTION OF A PREFERRED EMBODIMENT

The present invention has utility in connection with a wafer fabrication process whereby semiconductor wafers are fabricated for eventual use as semiconductor integrated circuits. This fabrication process typically consists of numerous stations where processing steps occur and requires that the wafers be stored, transported and positioned for processing at the various stations.

Figure 1:
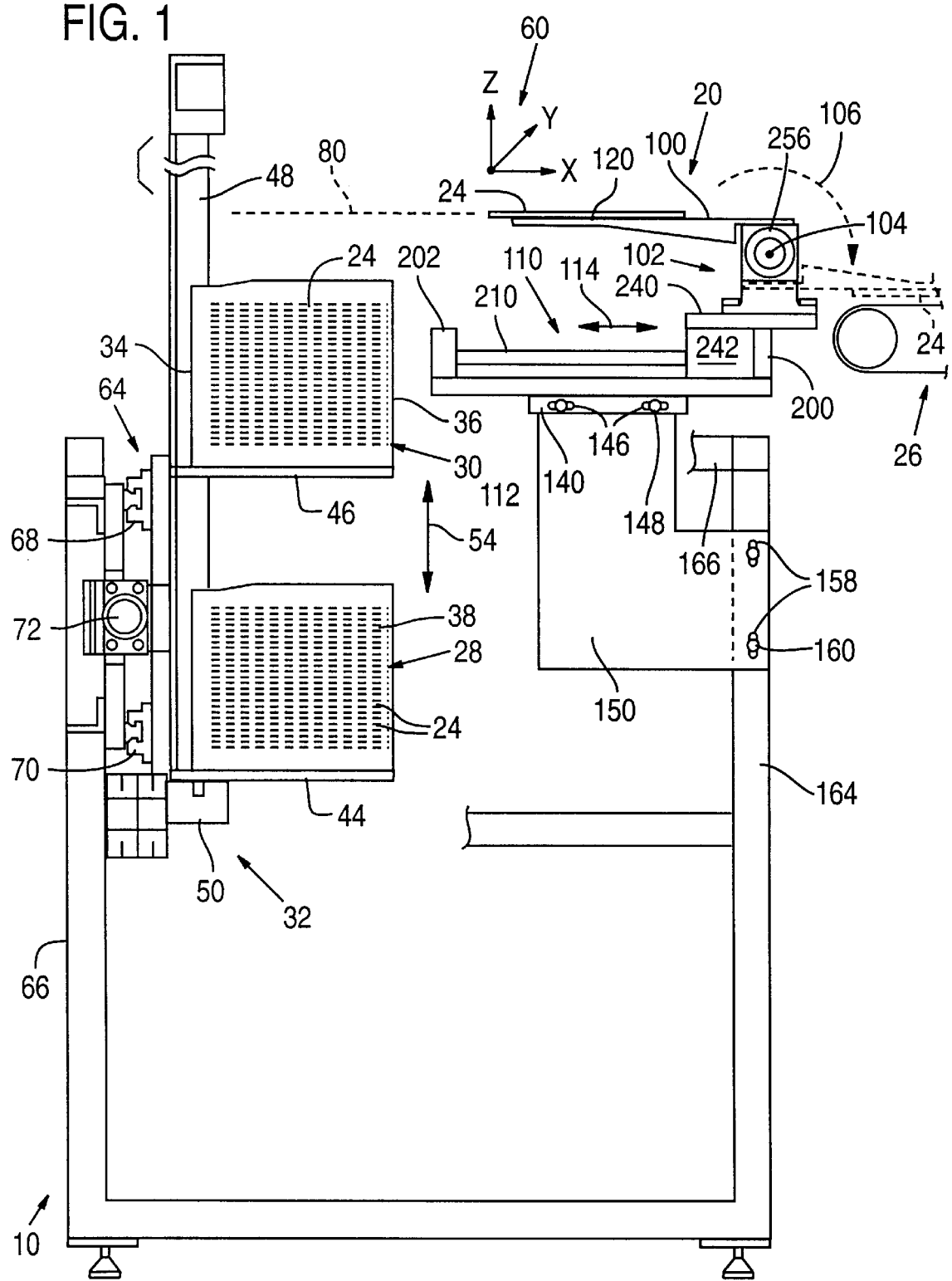
FIG. 1 is a side elevational view of a wafer transfer mechanism of the present invention shown mounted to a support frame.

With reference to FIG. 1, a wafer handling station 10 is shown and includes a form of wafer transfer mechanism 20 in accordance with the present invention for shifting semiconductor wafers from station 10 to a location where further processing can take place. In FIG. 1, a semiconductor wafer 24 is shown being moved from the station 10 to a conveyor 26 which carries the wafer to a location where additional semiconductor wafer processing takes place.

In the illustrated environment in which the wafer transfer mechanism 20 is shown, a plurality of wafer containing cassettes, two being shown as 28, 30 in FIG. 1, are supported by an elevator 32. Each cassette 30 supports a stack of wafers therein, some being indicated at 24 in FIG. 1. Although not shown in detail, wafer cassettes 28, 30 are well-known in the art and typically have four sides, a bottom 34 and a top 36 (the cassettes being shown rotated 90 degrees in FIG. 1 so that the top 36 is in a vertical orientation). The top 36 is open so that wafers 24 may be loaded into and unloaded from the cassette through the open top. The semiconductor wafers are each received in a respective set of opposed grooves. Each set of grooves holds an individual wafer. The stack of wafers positioned in a wafer cassette are supported in the respective grooves in a spaced-apart relationship so that a gap is provided between each of the wafers when contained in the cassette. One such gap is indicated at 38 in FIG. 1.

Any convenient mechanism may be used to position cassettes at the desired location so that the wafer transfer mechanism 20 may retrieve an individual wafer 24 from the cassette and transfer it to the conveyor 26. In FIG. 1, the elevator 32 is illustrated for this purpose. In the illustrated elevator, first and second spaced-apart platforms 44, 46 are coupled to a guide 48, which may comprise a conventional ball screw mechanism, such as a Lin Tech Model M1-104424-CP ball screw mechanism, driven by a stepper motor 50. As the ball screw is rotated, the platforms 44, 46 are elevated or lowered, as indicated by the arrow 54, depending upon the direction of rotation of the ball screw 48. A shaft encoder and optional feedback encoder may be used to control and monitor the position of the ball screw.

In the embodiment of FIG. 1, the operation of this embodiment may be understood with reference to an X-Y-Z three-dimensional coordinate system indicated at 60. In this system, respective X, Y and Z axes are orthogonal to one another. Also, although this can be varied, in the illustrated embodiment the Z axis is vertical, the X axis is horizontal, and the X-Z plane is vertical. In addition, the elevator 32 indexes the cassettes in a direction 54 which is most preferably vertical, and thus along the Z axis.

The wafer cassette indexing assembly, including the guide rod 48, may be mounted to a frame 64 while still permitting the vertical movement of the platforms 44, 46. The frame or mounting bracket 64 is coupled to a station frame 66. More specifically, in the illustrated form, the frame 64 is coupled by linear bearings 68, 70 to the station frame 66. An actuator, such as a pneumatic cylinder 72, is operable to shift the frame 64 in either direction along the Y axis. One suitable cylinder is a Model DGO-40-350-PPV-15226 air actuated positioning cylinder from Festo Corporation. Consequently, multiple stacks of cassettes may be positioned in the elevator 32 and shifted by the actuator 72 to successively place each cassette stack, such as cassettes 28, 30, in vertical alignment with the location from which wafers are to be unloaded from the wafer cassettes.

Actuation of the elevator 32 causes it to raise the platforms 44, 46 and thereby the cassettes 28, 30. Eventually, the cassette 36 is positioned at a location where the undersurface of the first wafer in the cassette to be transferred is at an elevation slightly above a pre-determined height, which is indicated at 80 in FIG. 1. When at this height, the wafer may be engaged by the wafer transfer mechanism 20, as described below. Thereafter, the elevator raises (or lowers) the cassettes 28, 30 so that a second wafer in one of the cassette is positioned at the desired height for engagement with and transfer by the wafer transfer mechanism. Similarly, after one cassette (e.g. cassette 30) is empty, the elevator may position the second cassette (e.g. the cassette 28) such that wafers in the second cassette may individually be removed by the wafer transfer mechanism. The elevator 32 may be operated to index the cassettes to permit unloading of wafers starting from the uppermost wafer of the upper cassette of the stack and moving toward the bottom of the cassette, or starting from the uppermost wafer at the bottom of the lowermost cassette moving toward the top of the cassette, or in any other desired order.

Any suitable cassette handling mechanism which positions the wafers at the desired elevation for handling by the wafer transfer mechanism 20 may be used. As shown in FIG. 1, the wafers 24 are indexed with their undersurface in a generally horizontal plane. However, the cassettes may be tilted and the wafer transfer mechanism operated to transfer wafers that are tilted from horizontal, as well. Although the illustrated embodiment of the wafer transfer mechanism 20 of the invention is described in a working relationship with the elevator 32, the wafer transfer mechanism may also be used in conjunction with other wafer delivery systems, such as conveyors or slides. Also, stationary wafer work stations can be arranged to position the wafers 24 at the appropriate elevation to be picked up by the wafer transfer mechanism 20 for transfer to the destination location.

The purpose of the wafer transfer mechanism 20 is to remove individual wafers 24 from the wafer cassettes 28, 30 and to transfer the individual wafers to a destination which, again, may be the conveyor belt 26, to a water slide, or to a work station (not shown).

Figure 2:
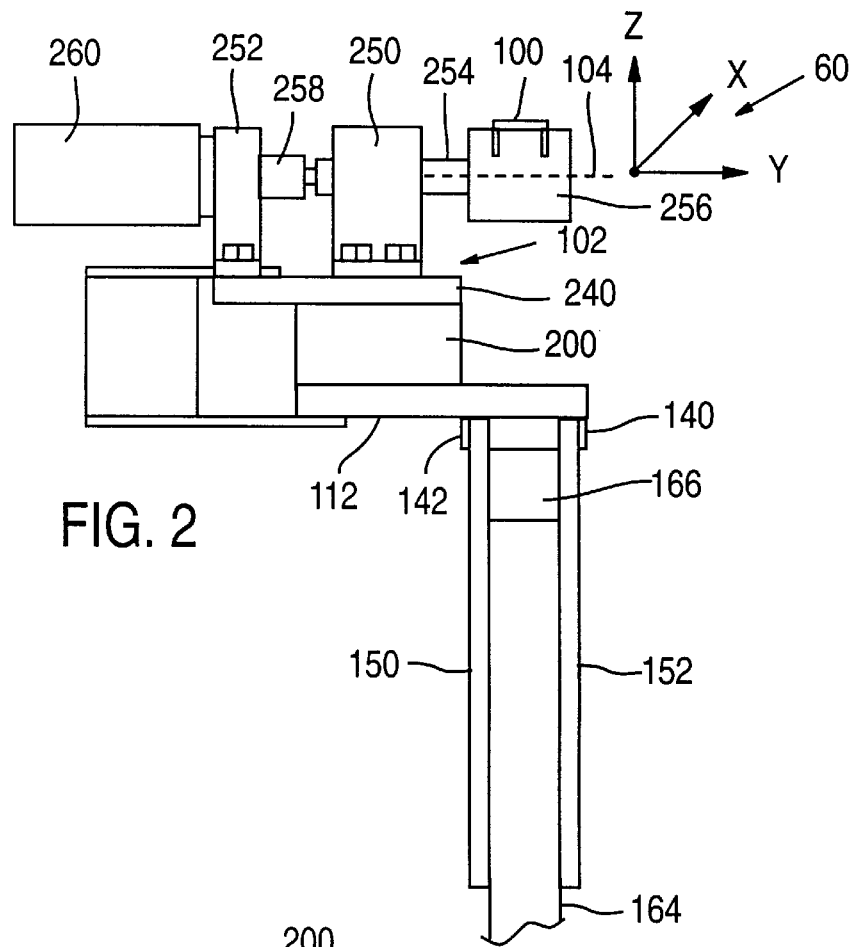
FIG. 2 is a rear elevational view of the wafer transfer mechanism of FIG. 1.
Figure 3:
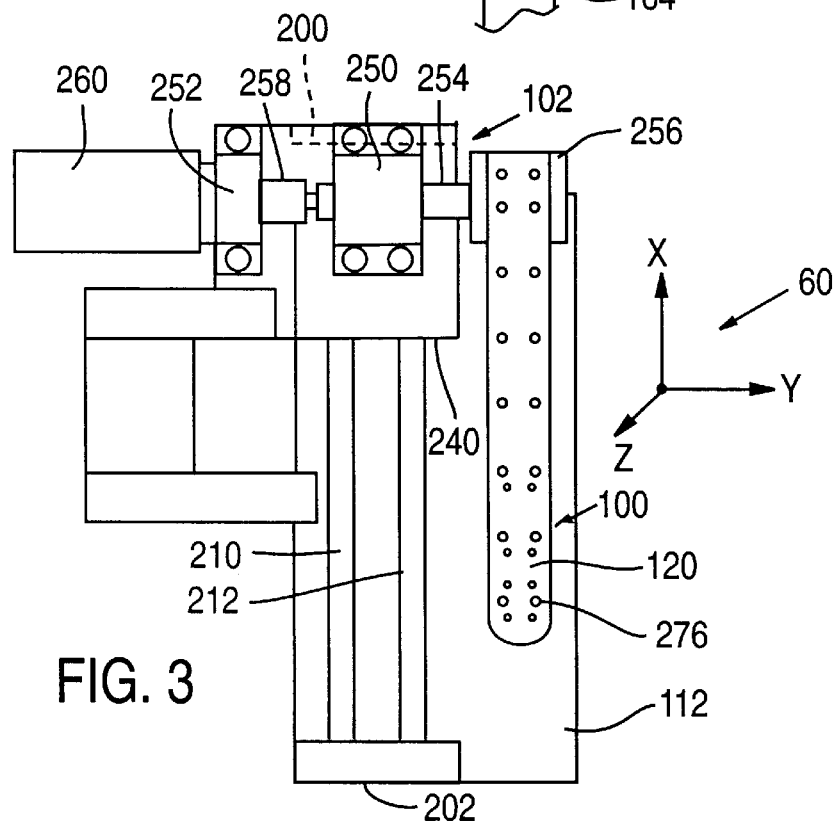
FIG. 3 is a top plan view of the wafer transfer mechanism of FIG. 1.

With reference to FIGS. 1, 2 and 3, one form of a wafer transfer mechanism 20, in accordance with the present invention, will be described. More specifically, the illustrated wafer transfer mechanism includes an elongated arm 100 pivoted to a platform 102. The arm is mounted for pivoting about an axis 104, as indicated by an arrow 106, between a first position shown in solid lines in FIG. 1, and a second position shown in dashed lines in FIG. 1. Thus, with reference to the coordinate system 60, the longitudinal axis of the arm 100 in this illustrated embodiment travels in the X-Z plane when shifting between the first and second positions.

The platform 102 is also movably coupled by a coupling mechanism 110 to a base 112 so that the platform is movable in opposite directions as indicated by the arrow 114. Again, with reference to the coordinate system 60, the platform 102 is linearly translated in opposite directions along the X axis. Because the arm 100 is supported by the platform 102, the arm also translates with the translation of the platform. Consequently, from the position shown in FIG. 1, the platform may be moved linearly toward a wafer positioned at the elevation 80 so that the arm is placed beneath the undersurface of the wafer. A detachable coupling mechanism, such as a vacuum mechanism described in greater detail below, is then activated to couple the wafer to a wafer engaging or supporting surface 120 of the elongated arm. The platform may then be translated linearly in the opposite direction to extract the now coupled wafer from the wafer cassette. After the wafer clears the wafer cassette, the arm is pivoted about the axis 104 to place the wafer at a destination location such as shown in dashed lines in FIG. 1. The wafer then may be decoupled from the arm, for example by relieving the vacuum, to deposit the wafer at the destination location such as onto the conveyor 26.

The illustrated base 112 includes a pair of downwardly projecting mounting flanges 140, 142 (FIG. 2), each having a pair of spaced apart horizontally extending elongated mounting slots 146. Bolts or other fasteners, one being indicated at 148 in FIG. 1, are inserted through the slots 146 and through upright base support flanges 150, 152 to rigidly fix or mount the base 112 to the support flanges 150, 152. The support flanges each include respective vertically extending elongated slots 158 (FIG. 1) through which mechanical fasteners, such as bolts 160 (one being shown in FIG. 1), are inserted to mount the flanges 150, 152 and thereby the base 112 and supported wafer transfer mechanism 20 to an upright frame member 164 of the station 10. The elongated slots 146, 158 permit respective horizontal and vertical positioning adjustment of the base 112 and thereby of the wafer transfer mechanism. A frame crosspiece 166 passes between the flanges 150, 152 and provides further rigidity to the construction.

The base 112 includes upwardly projecting end plates 200, 202 which are located at the respective ends of the base.

The coupling mechanism 110 may take any convenient form which permits the desired motion of the platform relative to the base and most preferably which permits linear translation of the platform relative to the base. The illustrated coupling mechanism includes first and second guide rails 210, 212 which are supported by the respective end plates 200, 202. The platform 102 is slidably carried by the rails 210, 212 for movement, in this case, toward and away from the elevator 32 along the X axis. The end plates 200, 202 act as stops or bumpers to limit the motion of the platform 102.

The illustrated platform 102 includes a horizontal arm support plate 240 mounted to a slide block 242. The slide block is slidably mounted to the rails 210, 212. Although bearings may be used for coupling the slide block to the rails, typically bearings are not used. Instead, the slide block is typically made of a friction reducing material such as Teflon plastic, nylon, or other such material so that it slides freely on the rails 210, 212. In addition, the rails are typically made of polished stainless steel to facilitate this sliding motion. A pneumatic cylinder or other actuator, not shown, is activated to move the slide block 242 and thereby the arm support plate 240 toward and away from the elevator 32. Instead, the slide block 242 may be an air actuated positioning cylinder block, such as from Festo Corporation.

A bearing support block 250 (FIGS. 2 and 3) and a motor support block 252 are mounted to the arm support plate 240 and thus to the movable slide block 242. The bearing support block 250 supports shaft bearings (not shown) which in turn support a shaft 254. The shaft 254 is coupled to an arm block 256 at an outboard end of the shaft and to a motor shaft coupling 258 at its inboard or opposite end. The coupling 258 is mounted to the shaft output of a motor 260 which is supported by the motor support block 252. A motor 260 is one form of a suitable actuator for pivoting the arm 100 about the pivot axis 104. In the illustrated embodiment, the motor comprises a stepper motor which precisely controls the rotation of the shaft 254 and thus the arm 100.

The arm 100 is mounted to the arm block 256 for movement with the motion of the arm block and correspondingly with the motion of the shaft 254. Actuation of the motor 260 to rotate in a first direction drives the shaft 254 in the first direction, which in turn rotates the block 256 and arm 100 in the first direction. Conversely, rotation of the motor 260 in the opposite direction causes the arm 100 to pivot in the opposite direction.

An illustrated preferred embodiment of the arm 100 is shown in FIGS. 4A–4D. The arm 100 includes a proximate or first end portion 262. End portion 262 is mounted by mechanical fasteners (not shown) extending through openings 264 (two of which are numbered in FIG. 4A) into the arm mounting block 256. The distal end 266 of the arm 100 includes the wafer engaging surface 120 along the upper surface of the arm. The illustrated arm 100 includes a first upper arm section 270 and a second lower arm sections 272. The wafer engaging surface 120 is provided at the upper side of the arm section 270. The surface 120 in the preferred embodiment is generally planar. The wafer engaging surface is made of a material which minimizes damage to the engaged wafer surface. For example, the surface 120 may be of stainless steel with an optional wafer surface protective coating, such as Teflon plastic. The arm sections 270, 272 are also preferably of this material although they may be of other durable materials. The arm section 270 includes a vacuum cavity 274 extending along its length. The vacuum cavity 274 communicates through the plate 272 via a port 277 located at end 272 of the arm. The port 277 is in a fluid communication with a vacuum source. The chamber 274 is otherwise closed from below by the arm section 272.

A plurality of vacuum ports, some being numbered as 276 in FIGS. 4A–4D, communicate between the semiconductor wafer supporting surface 120 and the chamber 274. Consequently, when a semiconductor wafer is engaged by the wafer supporting surface 120 and a vacuum is drawn in the chamber 274 via the port 277, a vacuum is correspondingly drawn at the apertures 276. This vacuum detachably couples the wafer to the arm. Typically, a vacuum of 24 to 27 inches of water is drawn to securely hold the semiconductor wafer in place. Following pivoting of the arm to the destination location, the vacuum is relieved to allow the semiconductor wafer to decouple from the arm at the destination location.

Mechanical fasteners, not numbered in FIGS. 4A–4D, are typically used to secure the arm sections 270, 272 together. In addition, reinforcing gussets 280, 282 extend from a location adjacent the proximal end 272 of the arm to a location approximately midway along the length of the arm. The gussets 280, 282 help to rigidify the arm structure. The gussets terminate short of the proximate end of the arm 100 to provide an arm block receiving notch 279 which abuts the arm block 256 when the arm is mounted in place.

With this construction, as can be seen in FIG. 4B, the distal end portion of the arm 100 is very thin and plate-like. In one specific embodiment, the thickness of the distal end of the arm between the opposed major surfaces is about 0.02 to 0.027 inches. Consequently, the arm may be inserted into the gap between semiconductor wafers as the wafers are being extracted from a wafer cassette.

Although the illustrated embodiment of the arm 100 is advantageous, other arm shapes and constructions may be used and other coupling mechanisms may be used for engaging and removing wafers from a wafer cassette.

Figure 5:
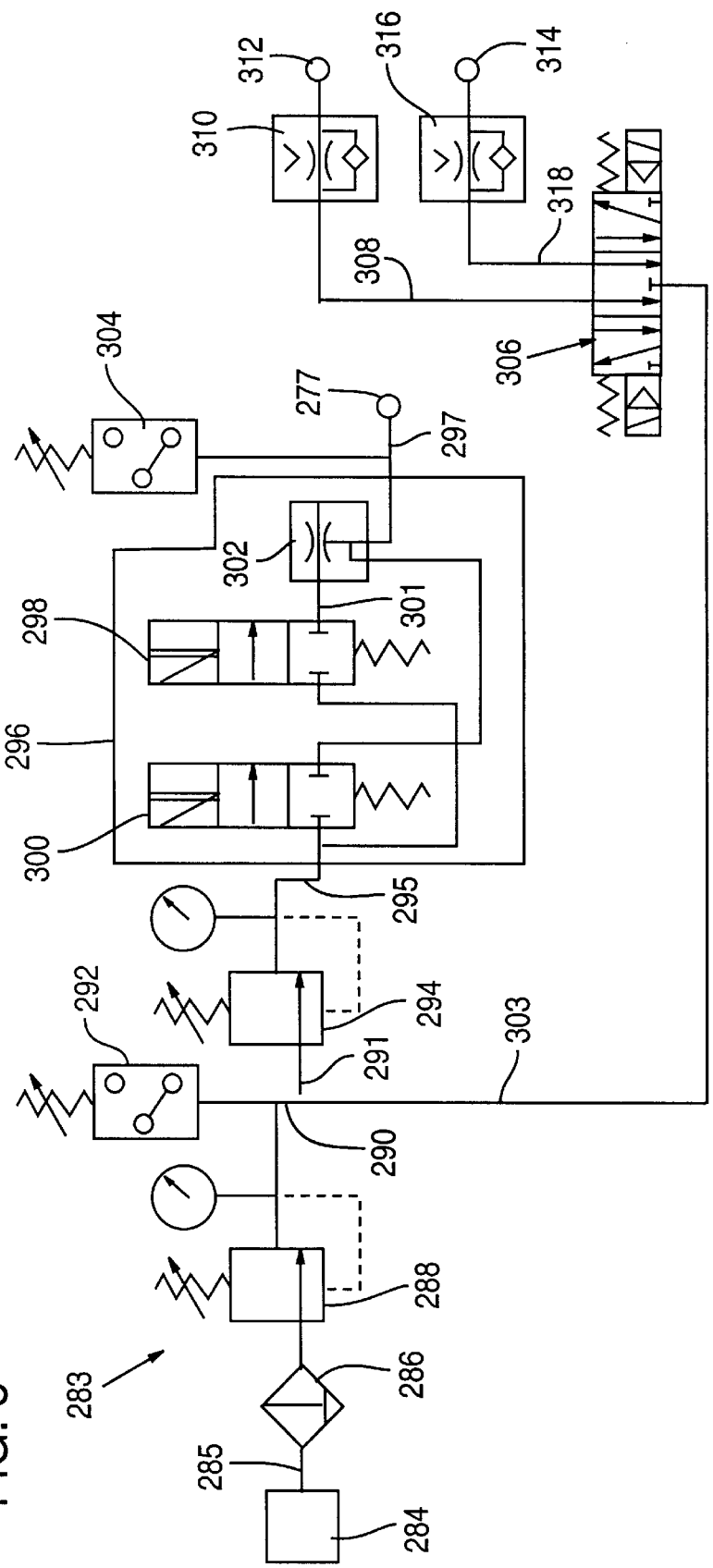
FIG. 5 is a schematic diagram of a pneumatic system used in the wafer transfer mechanism of FIG. 1.

A suitable pneumatic system 283 for the wafer transfer mechanism 20 is shown in FIG. 5. A source of pressurized air 284 provides pressurized air into a pneumatic line 285. From the source of pressurized air 284, the air flows to an air filter and dryer 286 and then to a filter and regulator 288. Thereafter, the air splits along three paths at a junction 290, with a portion of the air flowing into a pressure switch 292. The pressure switch 292 is provided for the purpose of monitoring the air pressure at junction 290 and signaling when the air pressure is too low for the desired operation of the transfer mechanism.

Another airflow branch 291 from junction 290 passes to a regulator 294 and then via a line 295 to a vacuum generator 296 that is pneumatically coupled via a line 297 to the port 277 of the arm 100. The vacuum generator selectively provides a partial vacuum in the channel 274 so that air is drawn in through the apertures 276 for purposes of holding a wafer on the wafer supporter surface 120.

To generate a vacuum at the port 277, a two-way/two-position valve 298 is operated to provide a flow path through the valve 298 between lines 295 and 297. At this time, another two-position/ two-way valve 300 is operated to block the flow of air through this valve. Air passing through valve 298 flows through a main air passage 301 of a venturi type vacuum generator 302 which causes a vacuum to be drawn at line 297 and then at the port 277. A pressure switch 304 is also provided for the purpose of detecting a vacuum in line 297, which results when a wafer is coupled to arm surface 120, and indicating the presence of the wafer. When a vacuum is drawn at port 277, a wafer is detachably coupled to the distal end of the arm. After the arm is pivoted to the destination location, the valve 298 is shifted to the position shown in FIG. 5, airflow through valve 298 between lines 295 and 301 stops, and the vacuum is relieved. To assist in decoupling the wafer, at this time the optional valve 300 is briefly shifted to provide a flow path through this valve between lines 295 and 297 and to the port 277. This permits a short burst of air (a puff) to be delivered to the port 277, the channel 274 (FIG. 4A) and then to the outlets 276 to assist in decoupling the wafer from the arm 100. For example, the pulse of air may be delivered for a time period of 0.5 to 1.5 seconds.

Returning to the junction 290, a third leg 303 for air flow passes to a platform shifting solenoid controlled valve 306, which is operable to control the delivery of air to an air cylinder used as an actuator in the illustrated embodiment to move the platform 102 (FIG. 1) toward and away from a wafer cassette. The illustrated solenoid controlled valve 306 is a four-way, three-position valve. This valve is biased to its middle position as shown, which blocks the pneumatic line 303 and thus the flow of air through the valve. When the valve is operated to shift to the right in FIG. 5, air flows through the valve from line 303 to a line 308 and through a flow control valve 310 to a port 312. The port 312 is coupled to one side of a pneumatic cylinder utilized in the illustrated embodiment to move the platform 102. In response to this air supply, the platform 102 is moved in a first direction along the X axis, for example toward the waiting wafer cassette. At the same time, air at the opposite side of the air cylinder is vented through a port 314, a flow control valve 316, a line 318 and the valve 306. Consequently, as air is supplied to one side of a pneumatic cylinder to move the platform, air is relieved from the other side of the pneumatic cylinder. Conversely, when valve 306 is shifted to the left in FIG. 5, air is delivered through the valve 306 from line 303 to the line 318, through the flow control valve 316 and through the port 314 to the opposite side of the pneumatic cylinder to thereby move the platform 102 in the opposite direction. Simultaneously, air from the opposite side of the cylinder is vented via a path through port 312, flow control valve 310, line 308, and the valve 306. The valve 306 operates in response to control signals from the controller, not shown.

The pneumatic system of FIG. 5 may also feed (via the line 303) yet another four-way, three-position solenoid operated valve coupled to a pneumatic actuator 72 (FIG. 1) for shifting the stacks of cassettes of the elevator 32 transversely to align a stack of cassettes in position for retrieving wafers from the cassettes using the arm 100.

With reference to FIG. 1, in operation, the elevator 32 moves a cassette, such as cassette 30, in the Z direction to place the undersurface of a wafer 24 in a horizontal plane at an elevation 80 that is approximately level with, but preferably is slightly above, the wafer engaging surface 120 of the arm 100. The pneumatic system is then actuated to cause the platform 102 to shift in the X direction to place the arm beneath the wafer to be removed from the stack. Stop block 202 limits the motion of the arm toward the wafer cassette. Thus, the valve 306 (FIG. 5) is operated to deliver air to a pneumatic cylinder coupled to the platform 102 for purposes of moving the platform. The arm enters the cassette 30 and is located slightly below the wafer to be transferred. Thereafter, the motor 260 (FIG. 2) is actuated to raise the arm 100 slightly toward the wafer surface. The pneumatic system is also operated so that the vacuum generator 296 (FIG. 5) causes a vacuum to be drawn at the port 277 and thereby through the openings 276 located at the wafer engaging surface at the distal end of the arm. As a result, the wafer is detachably coupled to the arm by the force of the partial vacuum. The pneumatic system is then operated to control the platform 102 to move the platform in the opposite direction to the location shown in solid lines in FIG. 1. The stop 200 limits the motion in this direction.

The motor 260 is again actuated to pivot the arm 100 about the axis 104 with the longitudinal axis of the arm travelling in the X-Z plane. In the illustrated embodiment, the arm pivots through approximately 180 degrees to thereby flip the wafer over the top of the platform and orient what was once the upper side of the wafer in a downward facing orientation. This position is shown in dashed lines in FIG. 1.

The pneumatic system is then operated to relieve the vacuum from the arm and, in the illustrated embodiment, a pulse of air is delivered to the orifices 276 in the arm to prevent the wafer from sticking to the arm as a result of any incidental remaining vacuum. The wafer 24 is thus deposited at the destination location, such as onto the conveyor 26.

Thereafter, the motor 260 again pivots the arm 100 through the X-Z plane to the position shown in solid lines in FIG. 1. The wafer transfer mechanism 20 is again ready for movement toward the cassette 30 to retrieve another wafer 24.

Having illustrated and described the principals of our invention with reference to a preferred embodiment, it should be apparent to those of ordinary skill in the art that the invention may be modified in arrangement and detail without departing from its principles. For example, the wafer engaging surface may be at the underside of arm 100 with the wafers being picked up from above for transfer. We claim all such modifications as may fall within the scope and spirit of the following claims and equivalents thereto.

We claim:

1. A method of transferring an individual wafer from a stack of spaced apart wafers from a first location to a second location comprising:

positioning an elongated arm having a longitudinal axis so as to place a wafer engaging surface at the distal end of the arm in position to engage the individual wafer within the stack of spaced apart wafers, at the first location;

detachably coupling the wafer to the wafer engaging surface;

pivoting the distal end of the arm through an arc and about an axis which is transverse to the longitudinal axis of the arm to flip the wafer engaging surface over to position the wafer above the second location; and releasing the coupled wafer from the wafer engaging surface to deposit the wafer at the second location.

2. A method according to claim 1 including the step of returning the arm by pivoting the arm about the transverse axis to flip the wafer engaging surface over to an upwardly facing orientation and thereafter repeating the steps of claim 1.

3. A method according to claim 1 in which the detachably coupling step comprises the step of drawing a vacuum between the wafer engaging surface and a surface of the wafer to detachably couple the wafer to the wafer engaging surface and the step of releasing the coupled wafer from the wafer engaging surface comprises the step of releasing the vacuum to release the coupled wafer.

4. A method of transferring an individual wafer from a first location to a second location comprising:

positioning an elongated arm having a longitudinal axis so as to place a wafer engaging surface at the distal end of the arm in position to engage a wafer at the first location, by inserting the arm beneath an individual wafer in a stack of spaced-apart wafers to place the wafer engaging surface beneath the wafer at the first location;

detachably coupling the wafer to the wafer engaging surface;

pivoting the distal end of the arm through an arc and about an axis which is transverse to the longitudinal axis of the arm to flip the wafer engaging surface over to position the wafer above the second location; and releasing the coupled wafer from the wafer engaging surface to deposit the wafer at the second location.

5. A method according to claim 4 in which the arm is pivoted to a sliding platform for pivoting about the transverse axis and wherein the positioning of an elongated arm step comprises the step of sliding the platform in a first direction to insert the arm beneath the wafer, the detachable coupling step then taking place followed by a step of sliding the platform in a second direction to remove the arm and coupled wafer away from the stack of wafers and by the step of pivoting the arm about an axis.

6. A method of transferring an individual wafer from a stack of spaced-apart wafers from a first location to a second location, the method comprising:

linearly translating an elongated wafer transfer arm to position a wafer engaging surface at the distal end portion of the wafer transfer arm beneath a wafer;

detachably coupling the wafer to the wafer engaging surface;

linearly translating the arm in a second direction opposite to the first direction to remove the distal end portion of the arm and the coupled wafer from the stack;

pivoting the arm about an axis which is transverse to a longitudinal axis of the arm to move the distal end portion of the arm and coupled wafer about the pivot axis to position the coupled wafer above the second location, with the wafer engaging surface being shifted to a downward orientation when the coupled wafer is above the second location; and releasing the wafer from the wafer engaging surface to transfer the wafer to the second location.

7. A wafer handling apparatus for extracting an individual wafer from a stack of spaced-apart wafers and for transferring the extracted wafer to a destination, the wafer handling apparatus comprising:

a base;

a platform movably coupled to the base for movement relative to the base between first and second positions;

an elongated arm with a longitudinal axis and having a first arm end portion pivotably coupled to the platform for pivoting about an arm pivot axis which is transverse to the longitudinal axis, the arm also having a distal arm end portion spaced from the first arm end portion, the distal arm end portion having a wafer engaging surface, the arm being pivoted to the platform such that pivoting the arm shifts the distal arm end portion about the arm pivot axis and thereby the wafer engaging surface between a wafer loading position in which the wafer engaging surface is upwardly oriented and a wafer unloading position in which the wafer engaging surface is downwardly oriented;

a platform mover operable to shift the platform relative to the base between the first and second positions;

an arm pivoter operable to pivot the arm about the arm pivot axis to shift the wafer engaging surface from the wafer loading position to the wafer unloading position; and wherein the wafer handling apparatus is operable to extract and transfer an individual wafer from the stack by shifting the platform from the first to the second position to place the wafer engaging surface beneath an individual wafer, selectively coupling the wafer to the wafer engaging surface, shifting the platform and thereby the coupled wafer to the second position, pivoting the pivot arm to move the wafer engaging surface between the wafer loading position and the wafer unloading position above the destination, and releasing the coupled wafer from the wafer engaging surface to transfer the wafer to the destination.

8. A wafer handling apparatus according to claim 7 in which the wafer coupler comprises a vacuum coupler operable to selectively apply a vacuum between the wafer engaging surface and a wafer to couple the wafer to the wafer engaging surface and operable to relieve the vacuum to release the wafer from the wafer engaging surface.

9. A wafer handling apparatus according to claim 7 in which the wafer coupler comprises a vacuum source and wherein the arm includes a plurality of apertures in the wafer engaging surface, the apertures being in a fluid communication with the vacuum source, and wherein operation of the vacuum source creates a partial vacuum between the wafer engaging surface and the wafer to selectively couple the wafer to the wafer engaging surface, and wherein the vacuum is relieved to selectively release the wafer from the wafer engaging surface.

10. A wafer handling apparatus of claim 7 wherein the stack of spaced-apart wafers comprises a plurality of wafers stacked in a wafer cassette.

11. A wafer handling apparatus according to claim 7 in which the platform is mounted to the base for sliding movement in a first linear direction to move the platform from the first to the second position and in a second linear direction opposite to the first linear direction to move the platform from the second position to the first position.

12. A wafer handling apparatus operable in a three dimensional reference system having orthogonal X, Y and Z axes and wherein the X-Z, X-Y and Y-Z axes lie in orthogonal planes, the wafer handling apparatus comprising:

a base;

a platform translatable relative to the base along the X axis between first and second positions;

an elongated arm having a distal end portion with a wafer engaging surface and a proximal end portion, the arm having a longitudinal axis and being pivoted to the platform at its proximal end portion such that the arm pivots in the X-Z plane between first and second arm positions, wherein when the arm is in the first arm position the wafer engaging surface is oriented upwardly and when the arm is in the second arm position the wafer engaging surface is oriented downwardly;

a wafer coupler operable to selectively couple a wafer to the wafer engaging surface;

a platform mover operable to shift the platform between the first and second positions;

an arm pivoter operable to pivot the arm between the first and second arm positions; and wherein the platform mover is operable to shift the platform when the arm is in the first arm position, in a first direction along the X axis to the first platform position to thereby position the arm in the first arm position with the wafer engaging surface oriented upwardly beneath a wafer to be transferred, the wafer coupler is operable to selectively couple the wafer to the wafer engaging surface, the platform mover is operable to shift the platform to the second position, the arm pivoter is operable to pivot the arm between the first and second arm positions to thereby position the coupled wafer above the destination, and wherein the wafer coupler releases the wafer to transfer the wafer to the destination.

13. A wafer handling apparatus according to claim 12 in which the arm pivoter is operable to pivot the arm through an arc of at least about 180 degrees between the first and second arm positions.

14. A wafer handling apparatus of claim 12 further comprising a wafer cassette containing a plurality of spaced-apart wafers and an elevator and wherein the cassette is supported by the elevator for movement along the Z axis, an elevator actuator coupled to the elevator for shifting the cassette along the Z axis to index wafers held in the cassette in position for selective coupling to the wafer engaging surface of the arm following the extraction of an individual wafer from the cassette and the transfer of the extracted wafer to the destination.

15. The wafer handling apparatus of claim 12 wherein the Z axis is substantially vertical and the X-Z plane is substantially vertical.

16. A method of transferring an individual wafer from a first location to a second location, the method comprising:

linearly translating an elongated wafer transfer arm to position a wafer engaging surface at the distal end portion of the wafer transfer arm beneath a wafer;

detachably coupling the wafer to the wafer engaging surface;

linearly translating the arm in a second direction opposite to the first direction to remove the distal end portion of the arm and the coupled wafer from a stack;

pivoting the arm about an axis which is transverse to a longitudinal axis of the arm to move the distal end portion of the arm and coupled wafer about the pivot axis to position the coupled wafer above the second location, with the wafer engaging surface being shifted to a downward orientation when the coupled wafer is above the second location; and releasing the wafer from the wafer engaging surface to transfer the wafer to the second location.

* * * * *